US009775259B2

(12) United States Patent
Zhang

(10) Patent No.: US 9,775,259 B2
(45) Date of Patent: Sep. 26, 2017

(54) GLASS COVER BOARD STRUCTURE

(71) Applicant: Shenzhen China Star Optoelectronics Technology Co., Ltd., Shenzhen, Guangdong (CN)

(72) Inventor: Yanxue Zhang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 206 days.

(21) Appl. No.: 14/423,118

(22) PCT Filed: Jan. 4, 2015

(86) PCT No.: PCT/CN2015/070069
§ 371 (c)(1),
(2) Date: Feb. 21, 2015

(87) PCT Pub. No.: WO2016/082310
PCT Pub. Date: Jun. 2, 2016

(65) Prior Publication Data
US 2016/0345452 A1    Nov. 24, 2016

(30) Foreign Application Priority Data
Nov. 25, 2014 (CN) .......................... 2014 1 0692611

(51) Int. Cl.
A47F 3/00        (2006.01)
H05K 5/03        (2006.01)
(Continued)

(52) U.S. Cl.
CPC ......... H05K 5/03 (2013.01); G02F 1/133308 (2013.01); H05K 5/0004 (2013.01);
(Continued)

(58) Field of Classification Search
CPC ............. A47F 3/005; A47F 3/007; A47F 3/12
See application file for complete search history.

(56) References Cited

U.S. PATENT DOCUMENTS 4,660,903 A * 4/1987 Shinagawa ........... A47F 3/0434
312/116
4,750,793 A * 6/1988 Rioux, Sr. ................. A47F 7/03
312/114
(Continued)

FOREIGN PATENT DOCUMENTS

CN       1891652 A      1/2007
CN     101680810 A      3/2010
(Continued)

Primary Examiner — Hanh V Tran
(74) Attorney, Agent, or Firm — Andrew C. Cheng

(57) ABSTRACT

A glass cover board structure comprises a top cover and a bottom plate, wherein, the top cover comprises a top plate and a plurality of side wall plates used in surrounding the top plate, the side wall plates at least comprise end surfaces, the bottom plate comprises a contacting area, and the end surfaces are adhesive to the contacting area. In the present invention, design a traditional planar glass cover board into a concave-shape glass cover board, remove assembling gaps to a rear cover of an electronic product when assembling the rear cover, and assemble the gaps at an invisible area after processing printing art to the glass cover board to achieve objects of raising appearing of electronic product.

11 Claims, 2 Drawing Sheets

(51) Int. Cl.
  *G02F 1/1333* (2006.01)
  *H05K 5/00* (2006.01)
  *H05K 5/02* (2006.01)

(52) U.S. Cl.
  CPC ............ *H05K 5/0243* (2013.01); *G02F 2001/133328* (2013.01); *G02F 2001/133331* (2013.01); *G02F 2201/46* (2013.01); *G02F 2202/28* (2013.01)

(56) References Cited

U.S. PATENT DOCUMENTS

| | | | | |
|---|---|---|---|---|
| 5,868,249 | A * | 2/1999 | Ehnert | A47F 3/085 206/315.9 |
| 6,398,322 | B1 * | 6/2002 | Chaplin | A47F 3/005 312/114 |
| 6,722,747 | B2 * | 4/2004 | House, II | A47F 3/005 312/114 |
| 6,808,074 | B1 * | 10/2004 | Schwartz | A47F 3/005 206/577 |
| 7,008,240 | B1 * | 3/2006 | Wang | H05K 5/0217 361/737 |
| 2011/0050054 | A1 * | 3/2011 | Chang | H04M 1/0266 312/223.1 |
| 2011/0136553 | A1 * | 6/2011 | Jo | G06F 1/1656 455/575.3 |
| 2012/0092821 | A1 * | 4/2012 | Raff | G06F 1/1616 361/679.02 |
| 2012/0118628 | A1 * | 5/2012 | Pakula | G06F 1/1626 174/520 |
| 2012/0275100 | A1 * | 11/2012 | Pakula | G06F 1/1626 361/679.01 |
| 2013/0063874 | A1 * | 3/2013 | Yi | H04M 1/0283 361/679.01 |
| 2013/0069502 | A1 * | 3/2013 | Hu | B29C 45/14467 312/223.1 |
| 2013/0088818 | A1 * | 4/2013 | Yamaguchi | C09J 7/02 361/679.01 |
| 2015/0130334 | A1 * | 5/2015 | Goppion | A47F 5/00 312/140 |
| 2016/0029817 | A1 * | 2/2016 | Goppion | A47F 3/001 312/140 |

FOREIGN PATENT DOCUMENTS

CN   102823338 A    12/2012
DE   19739394 A1 *  3/1999   ............ F16B 12/04

* cited by examiner

GLASS COVER BOARD STRUCTURE

FIELD OF THE INVENTION

The present invention relates to portable electronic product assembly field, in particular to a glass cover board assembly structure.

BACKGROUND OF THE INVENTION

With the rapid development of electronic technical industries, people use electronic products even more frequently at work and in daily life. When keeping enriching applicable functions of electronic products, appearance designs of the electronic products are also every important that researchers keep modifying and improving. In traditional method of electronic product assemblies, usually assemble a planar glass cover board and a concave rear cover, or dispose a link member between a planar glass cover board and a planar rear cover, and within these two assembled methods, a side surface of an electronic product appears an assembling gap when a electronic-product assembly is completed. Due to the shape differences of electronic-product parts, assembling gaps will appear big or small. If the assembling gaps are at the edge of the viewable area, the user is easily to notice the assembling gaps and the assembling gaps affect the appearance of the electronic product. In addition, to avoid the assembling gaps, the electronic product usually uses a complex assembly art and increase production cost.

SUMMARY

The technical problem solved by the present invention provides a glass cover board structure to prevent disposition gaps when assembling whole device of electronic product, and then achieve beneficial effects of improving appearances of electronic products and reducing assembly cost.

To achieve above objects of the present invention, the present invention adopts technical programs as following:

a glass cover board structure comprises a top cover and a bottom plate, wherein, the top cover comprises a top plate and a plurality of side wall plates used in surrounding the top plate, the side wall plates at least comprise end surfaces, the bottom plate comprises a contacting area, and the end surfaces are adhesive to the contacting area.

Further, both the end surfaces and the contracting area are flat surfaces.

Further, the end surfaces are first stepped surfaces, and the contacting area is a second stepped surface matching to the first step surfaces.

Further, the first stepped surface comprises two flat surfaces and a first transition surface connecting to the two flat surfaces; the second stepped surface comprises two flat surfaces and a second transition surface a second transition surface connecting to the two flat surfaces.

Further, the first transition surface is a bevel; the second transition surface is a bevel.

Further, the first transition surface is a vertical plane; the second transition surface is a vertical plane.

Further, the side wall plate further comprises an inner wall surface, the second stepped surface further comprises a location face, and the location face and the inner wall surface is contacting to each other.

Further, a double-sided tape is disposed between the end surface and the contacting area.

The beneficial effects of the present invention are:

In the glass cover board structure provided by the present invention, design a traditional planar glass cover board as a concave-shape glass cover board, remove assembling gaps to a rear cover of an electronic product when assembling the rear cover, and assemble the gaps at invisible area after processing printing art to the glass cover board to achieve objects of raising appearing of electronic product, at the same time, simplifying assembling art, reducing manufacturing obstacles of electronic product, and saving assembling cost of electronic products.

DETAILED DESCRIPTION OF THE EMBODIMENTS

The foregoing has outlined rather broadly the technical features and structures of the present invention in order that the detailed description of the invention that follows may be better understood.

Figure 1:
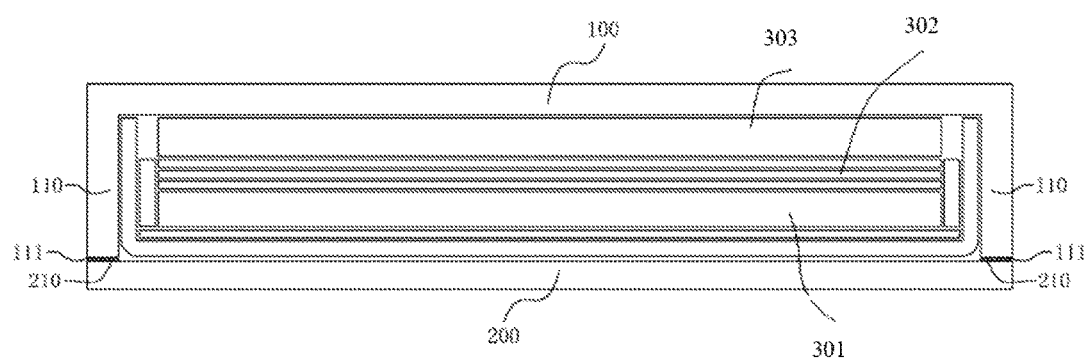
FIG. 1 is a structural schematic diagram of an embodiment 1 of the present invention.
Figure 2:
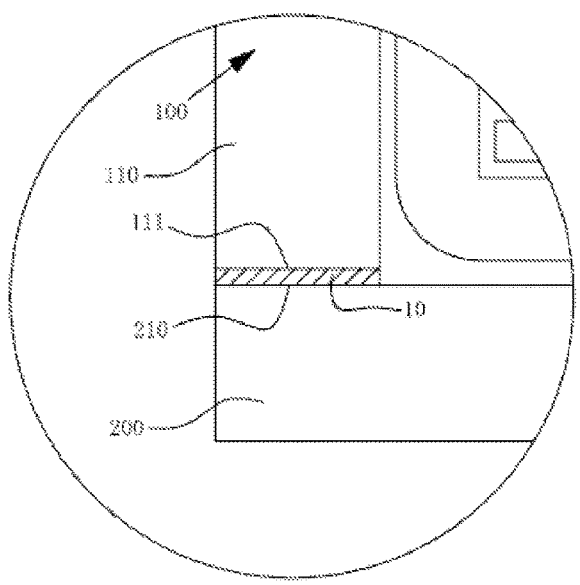
FIG. 2 is a partial enlarged view of a glass cover board structure of the embodiment 1 of the present invention.

Refer to FIG. 1, a glass cover board structure comprises a top cover 100 and a bottom plate 200, wherein, the top cover 100 comprises an integrated top plate and a plurality of side wall plates 110 used in surrounding the top plate, the side wall plates 100 at least comprise end surfaces 111, and the bottom plate 200 comprises a contacting area 210, and the end surfaces 111 are adhesive to the contacting area 210. The top cover 100 is a glass cover board, the top plate and any one side wall plate 110 form an L-shape structure which present a whole concave structure, and the assembling space is used to disposed a backlight module 301, a light guide plate 302, a liquid crystal panel 303 and etc. of an electronic product.

Embodiment 1

Refer to FIG. 1, the end surfaces 111 on the side wall plate 110 are flat surfaces, the contracting area 210 on the bottom plate 200 is a flat surface, a layer of double-sided tape 10 is disposed between the end surfaces 111 and the contacting area 210 when the end surfaces are adhesive to the contacting area, the double-sided tape 10 is used to adhesive and fixed the side wall plate 110 and the bottom plate 200 to connect the top cover 100 and the bottom plate 200 as an integrated structure.

Figure 3:
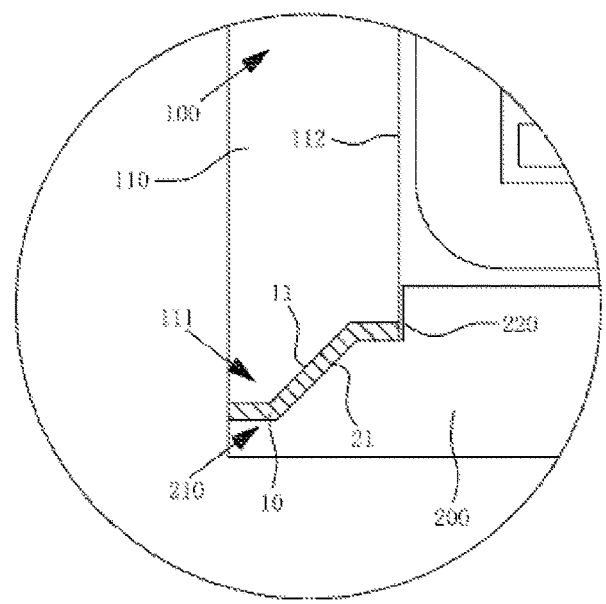
FIG. 3 is a partial enlarged view of a glass cover board structure of the embodiment 2 of the present invention.

Refer to FIG. 3, the end surfaces 111 on the side wall plate 110 are first stepped surfaces, and the contacting area 210 on the bottom plate 200 is a second stepped surface matching to the first step surfaces. The first stepped surface comprises two flat surfaces and a first transition surface 11 connecting to the two flat surfaces; the second stepped surface comprises two flat surfaces and a second transition surface 21 connecting to the two flat surfaces.

Wherein, the first transition surface 11 is a bevel; the second transition 21 surface is a bevel. When the end surfaces 111 are adhesive to the contacting area 210, the two flat surfaces on the side wall plate 110 are adhesive to the two flat surfaces on the bottom plate 200, the first transition surface 11 and the second transition surface 21 is adhesive to each other, a double-sided tape 10 is disposed between the end surface 111 and the contacting area 210 to adhere and fix the side wall plate 110 and the bottom plate 200 and to connect the top cover 100 and the bottom plate 200 as an integrated structure.

Moreover, the side wall plate 110 further comprises an inner wall surface 112, the second stepped surface further comprises a location face 220, the location face and the inner wall surface is contacting to each other while the end surface 111 adheres to the contacting area 210, and the location face 220 is used in providing locating effect between the top cover 100 and the bottom plate 200 when working with assembling to increase assembling rate between the top cover 100 and the bottom plate 200 and facilitate to decrease assembling gaps between the top cover 100 and the bottom plate 200.

Embodiment 3

Figure 4:
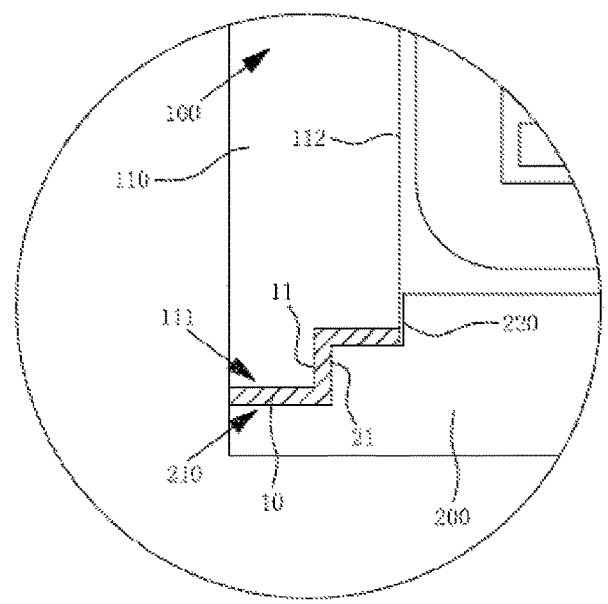
FIG. 4 is a partial enlarged view of a glass cover board structure of the embodiment 3 of the present invention.

Refer to FIG. 4, the end surfaces 111 on the side wall plate 110 are first stepped surfaces, and the contacting area 210 on the bottom plate 200 is a second stepped surface matching to the first step surfaces. The first stepped surface comprises two flat surfaces and a first transition surface 11 connecting to the two flat surfaces; the second stepped surface comprises two flat surfaces and a second transition surface 21 connecting to the two flat surfaces.

Wherein, the first transition surface 11 is a vertical plane; the second transition surface 21 is a vertical plane. When the end surfaces 111 are adhesive to the contacting area 210, the two flat surfaces on the side wall plate 110 are adhesive to the two flat surfaces on the bottom plate 200, the first transition surface 11 and the second transition surface 21 is adhesive to each other, a double-sided tape 10 is disposed between the end surface 111 and the contacting area 210 to adhere and fix the side wall plate 110 and the bottom plate 200 and to connect the top cover 100 and the bottom plate 200 as an integrated structure.

In addition, the side wall plate 110 further comprises an inner wall surface 112, the second stepped surface further comprises a location face 220, the location face and the inner wall surface is contacting to each other while the end surface 111 adheres to the contacting area 210, and the location face 220 is used in providing locating effect between the top cover 100 and the bottom plate 200 when working with assembling to increase assembling rate between the top cover 100 and the bottom plate 200 and facilitate to decrease assembling gaps between the top cover 100 and the bottom plate 200.

Further description that processing printing act to a electronic product after assembling whole device of inner parts, ex: the glass cover board and the light guide plate and etc., of the electronic product, because assembling gaps between the top cover 100 and the bottom plate 200 is disposed at the back of the electronic produce, the assembling gaps are located at invisible area when users watch the front of the electronic product directly, and simultaneously the printing act further facilitate in reducing visibilities of assembling gaps to make the assembling gaps not easy to find out and increase aesthetics of the electronic product.

To sum up, in the glass cover board structure provided by the present invention, design a traditional planar glass cover board into a concave-shape glass cover board, remove assembling gaps to a rear cover of an electronic product when assembling the rear cover, and assemble the gaps at an invisible area after processing printing art to the glass cover board to achieve objects of raising appearing of electronic product, at the same time, simplifying assembling art, reducing manufacturing obstacles of electronic product, and saving assembling cost of electronic products.

The foregoing description of the invention has been presented for purposes of illustration and description and is not intended to be exhaustive or to limit the invention to the precise form disclosed. Modifications and variations are possible in light of the above teaching. The embodiments were chosen and described to best explain the principles of the invention and its practical application to thereby enable others skilled in the art to best use the invention in various embodiments and with various modifications suited to the particular use contemplated.

The invention claimed is:

1. A glass cover board structure comprises a top cover and a bottom plate defining a portable electronic housing, wherein, the top cover is a concave structure comprising a top plate and a plurality of side wall plates used in surrounding the top plate, the top plate and the side wall plates are integrally formed, the side wall plates at least comprise end surfaces, the bottom plate comprises a contacting area, and the end surfaces are adhesive to the contacting area; wherein the top cover and the bottom plate together form an enclosed assembling space, a liquid crystal panel is disposed within the enclosed assembling space and covers by the top plate.

2. The glass cover board structure according to claim 1, wherein, both the end surfaces and the contracting area are flat surfaces.

3. The glass cover board structure according to claim 2, wherein, a double-sided tape is disposed between the end surfaces and the contacting area.

4. The glass cover board structure according to claim 1, wherein, the end surfaces are first stepped surfaces, and the contacting area is a second stepped surface matching to the first step surfaces.

5. The glass cover board structure according to claim 4, wherein, each first stepped surface comprises two flat surfaces and a first transition surface connecting to the two flat surfaces; the second stepped surface comprises two flat surfaces and a second transition surface connecting to the two flat surfaces.

6. The glass cover board structure according to claim 5, wherein, the first transition surface is a bevel; the second transition surface is a bevel.

7. The glass cover board structure according to claim 6, wherein, each side wall plate further comprises an inner wall surface, the second stepped surface further comprises a location face, and the location face and the inner wall surface is contacting to each other.

8. The glass cover board structure according to claim 7, wherein, a double-sided tape is disposed between the end surfaces and the contacting area.

9. The glass cover board structure according to claim 5, wherein, the first transition surface is a vertical plane; the second transition surface is a vertical plane.

10. The glass cover board structure according to claim 9, wherein, the side wall plate further comprises an inner wall surface, the second stepped surface further comprises a location face, and the location face and the inner wall surface is contacting to each other.

11. The glass cover board structure according to claim 10, wherein, a double-sided tape is disposed between the end surface and the contacting area.

* * * * *